United States Patent [19]

Craker

[11] Patent Number: 4,716,495

[45] Date of Patent: Dec. 29, 1987

[54] PRINTER CIRCUIT BOARD CHASSIS WITH POWER INTERLOCK

[75] Inventor: Robert Craker, Painesville, Ohio

[73] Assignee: Allen-Bradley Company, Inc., Milwaukee, Wis.

[21] Appl. No.: 909,710

[22] Filed: Sep. 22, 1986

[51] Int. Cl.[4] .............................................. H05K 7/14
[52] U.S. Cl. ................................... 361/391; 439/327; 361/415
[58] Field of Search .................. 361/391, 415; 211/41; 339/17 M, 17 LM, 75 MP; 439/327

[56] References Cited

U.S. PATENT DOCUMENTS

| | | | |
|---|---|---|---|
| 2,958,014 | 10/1960 | Blain | 361/415 |
| 3,691,430 | 9/1972 | Freitag | 361/415 |
| 3,729,657 | 4/1973 | Callan | 174/52 R |
| 3,992,654 | 11/1976 | Springer et al. | 361/415 |
| 4,151,580 | 4/1979 | Struger et al. | 361/415 |
| 4,152,750 | 5/1979 | Bremenour et al. | 361/383 |
| 4,302,820 | 11/1971 | Struger et al. | 364/900 |

FOREIGN PATENT DOCUMENTS 0856057 8/1981 U.S.S.R. .................. 339/75 MP

Primary Examiner—J. R. Scott
Assistant Examiner—Morris Ginsburg
Attorney, Agent, or Firm—Quarles & Brady

[57] ABSTRACT

A chassis for holding a plurality of printed circuit boards has a number of locations at which the printed circuit boards may be positioned. Each of the locations having opposed slotted tracks for holding opposite edges of the printed circuit board placed at that location. One of the locations holds a power supply for the chassis.

A printed circuit board retaining mechanism has a first position in which a tab extends across the slots in one of the tracks for each of the printed circuit board locations and a second position in which the tabs do not extend across the slot. Each of the printed circuit boards has a notch along one edge. When the printed circuit board is fully inserted into one of the locations in the chassis, the tab corresponding to that track engages the notch preventing the removal of the printed circuit board from the chassis. The retaining mechanism also includes a switch actuator which engages a switch on the power supply so that when the retaining mechanism is in the second position, the power to the chassis is turned off. This prevents the removal of one of the printed circuit boards while power is still being applied to it.

9 Claims, 5 Drawing Figures

PRINTER CIRCUIT BOARD CHASSIS WITH POWER INTERLOCK

BACKGROUND OF THE INVENTION

The present invention relates to enclosures for holding a plurality of printed circuit boards.

Card cages which contain and electrically interconnect a number of printed circuit boards are well-known. Typically these devices include a four-sided enclosure or a four-sided frame. A plurality of slotted tracks are located at the top and bottom of the enclosure to receive the opposite edges of the printed circuit boards. A back plane printed circuit board is usually mounted across the rear of the enclosure. The back plane provides a plurality of electrically interconnected terminals for mating with connectors on the printed circuit boards inserted in the tracks. Typically, a printed circuit board is inserted in the front end of the tracks and slid toward the rear of the enclosure until it makes good electrical contact with the connectors associated with those tracks.

In this fashion, different printed circuit board assemblies for a given piece of equipment may be held in place and electrically interconnected. One of the boards which is inserted in the enclosure may be the power supply for the remaining boards of the piece of equipment. In this case, the incoming electrical power is fed to this power supply board which then generates the various electrical power signals needed for the other boards. The signals are then supplied to the other boards through the back plane connectors.

One of the problems encountered in present day circuits, such as those using digital components, is that during the operation or maintenance of the equipment the operator may remove a printed circuit board from the chassis without turning off the electrical power. This may cause severe damage to the electrical components on the printed circuit board.

SUMMARY OF THE INVENTION

An electrical chassis has a plurality of locations at which a printed circuit board assembly may be mounted. Each location typically has two tracks for receiving the edges of the printed circuit board. Electrical connectors are provided to supply electrical power to the mounted printed circuit boards. A printed circuit board retainer releasably holds the board in each location. The retainer has a held state and a released state. Coupled to the retainer is a means for disconnecting the electrical power to the connectors when the retainer is in the released state and for applying power to connectors when the retainer is in the held state. The retainer prevents a board from being removed from the chassis while the electrical power is connected.

An object of the present invention is to provide an interlock mechanism which prevents a printed circuit board assembly from being inserted into or removed from the chassis without the power being disconnected. The interlock provides a conveniently located actuator for both controlling the power and the mechanism that releaseably retains the printed circuit boards.

DETAIL DESCRIPTION OF THE PREFERRED EMBODIMENT

Figure 1:
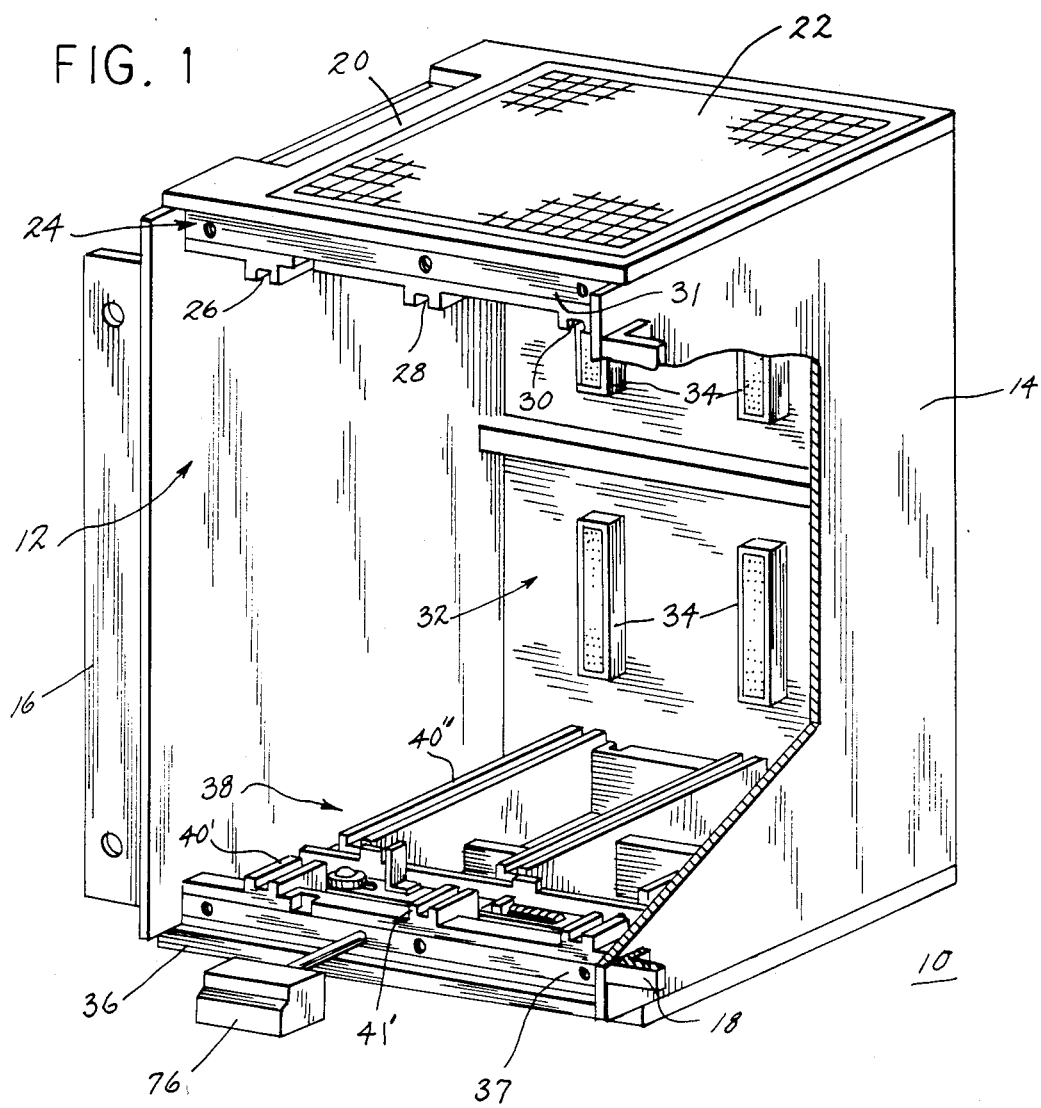
FIG. 1 is a perspective view of an enclosure for printed circuit boards incorporating the present invention.

With initial reference to FIG. 1, a printed circuit board chassis enclosure generally designated as 10 includes two sidewalls 12 and 14. Each of the sidewalls 12 and 14 has an L-shaped mounting bracket 16 and 18, respectively, extending vertically near the front of each wall for mounting the enclosure in a rack. Alternatively the brackets 16 and 18 can be positioned to the rear of sidewalls 12 and 14 for mounting the chassis in a cabinet. A topwall 20 extends between the two sidewalls 12 and 14 and has an open area in the center covered by a grill 22, which provides EMI and RFI protection while enabling cooling air to exit the top of the enclosure. On the interior surface of the topwall 20 is a upper printed circuit board guide structure 24 having three guide tracks 26, 28 and 30 of non-conductive material extending from front to back. Each of the guide tracks is an inverted U-shaped structure having an interior slot for receiving an edge of a printed circuit board. The guide structure 24 has a metallic bar 31 recessed into its front surface. The bar 31 has apertures therein for fastening the circuit boards and providing electrical grounding.

Across the back of the enclosure is a back plane printed circuit board 32 on which is mounted a number of electrical connectors 34. The back plane board 32 has foil inter-connect patterns thereon running between the various connectors 34 to provide electrical connection.

Figure 2:
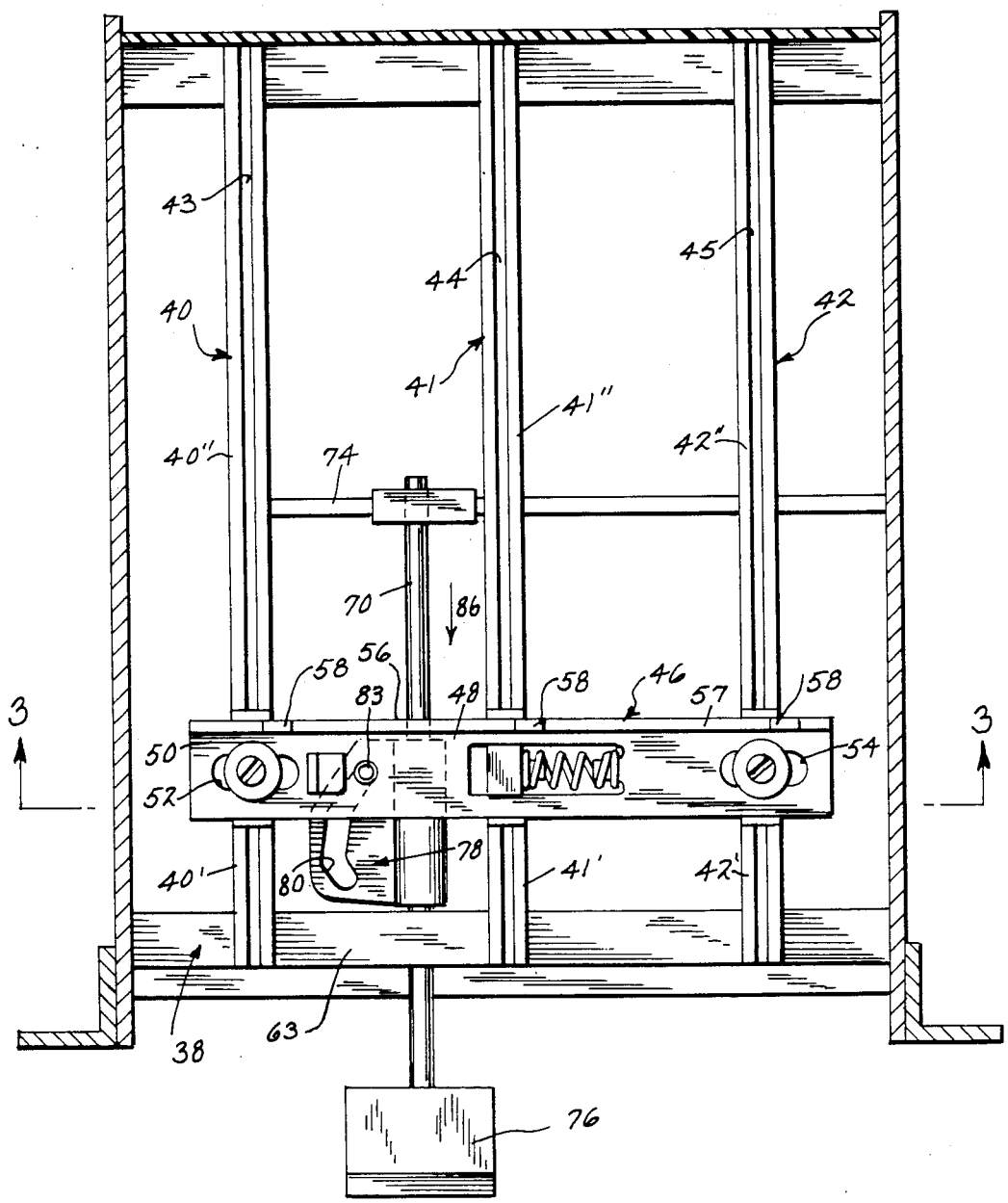
FIG. 2 is a horizontal cross-section through the center of the enclosure of FIG. 1 looking downward.

Extending across the bottom of the enclosure 10 is a bottom wall 36 on which is mounted a lower printed circuit board guide structure 38. The lower structure 38 has a fastening bar 37 on its front surface similar to upper bar 31. With reference to FIGS. 1 and 2, the lower guide assembly comprises three guide tracks 40, 41 and 42, each being positioned below one of the upper guide tracks 26, 28 and 30. Each pair of vertically opposed tracks (e.g. tracks 26 and 40) defines a printed circuit board location within the enclosure. Each of the lower guide tracks, such as track 40, consists of a short front portion (40') and a longer rear portion (40"). Both portions of each guide track 40, 41 and 42 are U-shaped members having slots 43, 44 and 45, respectively, along their length. The two sections of each of the lower tracks, 40' and 40", for example, are aligned so that the edge of a printed circuit board may be slid along the slot of the front section into the rear section slot. Both sections of each track are supported on a separate base 47 of the lower structure 38 (FIG. 3).

Figure 3:
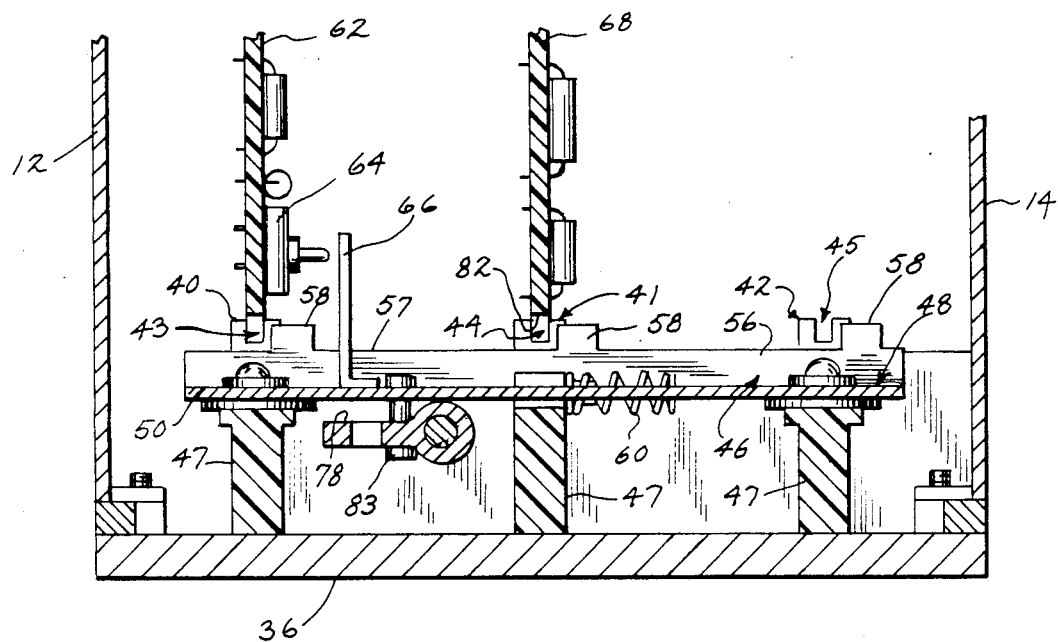
FIG. 3 is a sectional view taken along line 3—3 of FIG. 2 with two circuit boards installed in the enclosure and the retaining mechanism of the invention in one position.

With reference to FIGS. 2 and 3, a printed circuit board retaining mechanism 46 is in the gap between the front and rear sections of the lower guide tracks. The mechanism consists of a L-shaped metal slider 48 having a horizontal member 50 mounted on the lower printed circuit guide assembly 38 in the gap between the front and the rear sections of each of the tracks 40–42. Near opposite ends of the horizontal member 50 are elongated apertures 52 and 54 through which a mounting bolt passes fastening the horizontal portion to the lower guide structure 38. Teflon (Trademark E. I. du Pont de Nemours & Co.) washers may be used on the bolts above and below the horizontal member 50 to minimize friction when the slider 48 is moved laterally across the tracks.

The slider 48 also has a vertical member 56 orthogonal to the horizontal member 50. The vertical member extends across the front end of each of the rear portions 40″, 41″ and 42″ of the tracks. The upper edge 57 of the vertical member 56 is below the bottom of the slot in each track so as not to interfere with the sliding of the printed circuit boards along the track. As shown in FIG. 3, three tabs 58 extend upwardly from the upper edge 57 of the vertical member 56. Each tab is associated with one of the tracks 40–42. In the orientation of FIG. 3, the slider 48 is slid to the right so that each of the tabs is to the right of the longitudinal slot in the corresponding track. A compression spring 60 extends between the center track base 47 and the horizontal member 50 so as to bias the slider to the right in the orientation of FIGS. 2 and 3.

In FIG. 3 a power supply printed circuit board 62 is shown mounted in the first lower track 40 with one edge extending into the slot 43 of the first lower track. The upper edge of the board 62 extends into the slot in the first upper track 26 (not shown). The power supply has a pushbutton on/off switch 64 mounted on the printed circuit board. A power supply switch actuator lever 66 is mounted on the horizontal member 50 of the slider 48 in the vicinity of the power supply switch 64. A second printed circuit board 68 is shown mounted in the second lower track 41.

A slider actuator shaft 70 (FIG. 2) extends through an aperture in the front portion 63 of the lower guide structure 38 and through a second aperture in a center cross rib 74 of that structure. One end of the shaft 70 extends out of the front of the enclosure 10 and terminates with a rectangular knob 76. Fixed to the shaft 70 beneath the slider 48 is a cam plate 78 which has a cam slot 80 therein. A stud 83 extends from the horizontal member 50 of the slider 48 through the cam slot 80.

Figure 5:
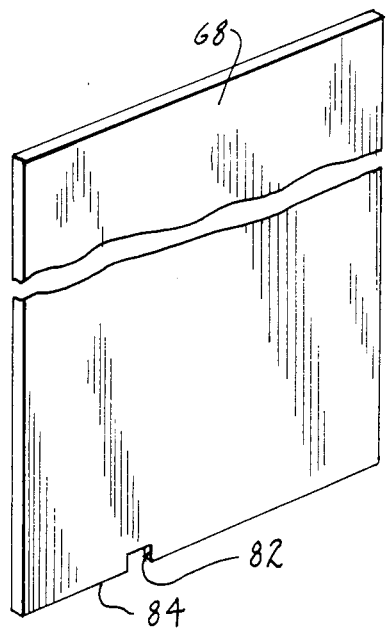
FIG. 5 is a perspective view of a printed circuit board for use with the present invention.

In FIG. 5 a printed circuit board, such as board 68, is shown having a notch 82 in its lower edge 84. The notch 82 is positioned along the edge 84 such that when the printed circuit board is fully inserted into the enclosure 10 along the tracks 40–42 the notch 82 will fall between the front and rear portions of the lower track. When boards are to be placed into or removed from the chassis 10, the handle 76 is pulled outward from the enclosure which moves the shaft 70 in direction 86 (FIG. 2). This also moves the cam plate 78 toward the front of the enclosure 10 causing the stud 83 to slide toward the rear of the cam slot 80 which results in the L-shaped slider 48 moving to the right as shown in FIGS. 2 and 3. This action moves the tabs 58 away from the slots 43–45 in the guide tracks. This position defines a released state in which the printed circuit boards may be slid in or out of the guide tracks from the front opening in the enclosure.

Figure 4:
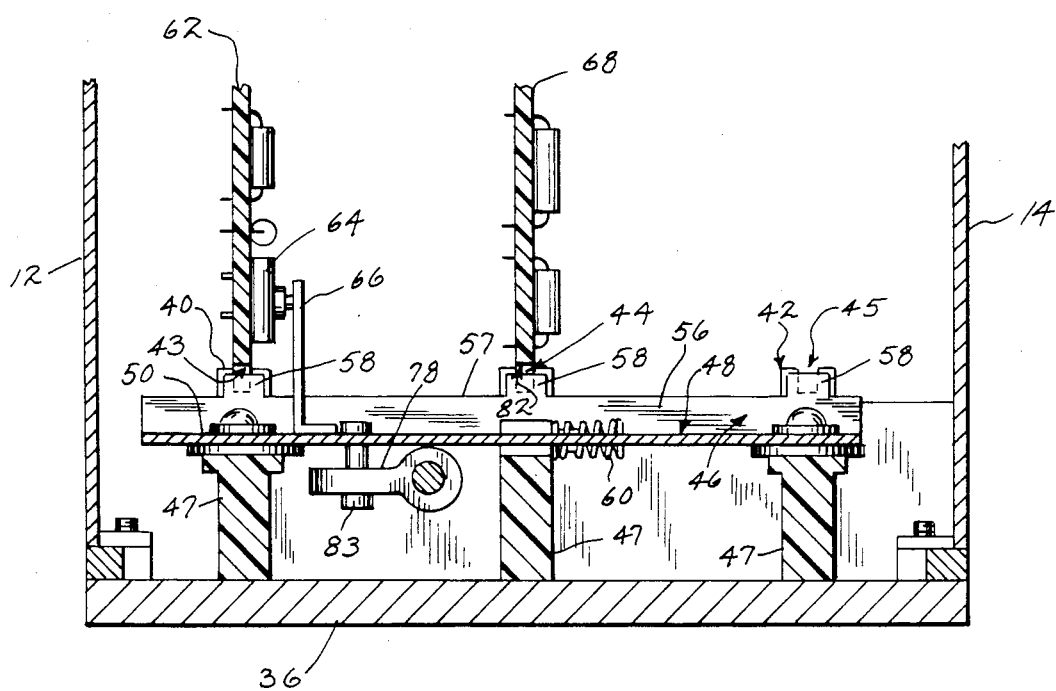
FIG. 4 is a view of the enclosure similar to FIG. 3 with the retaining mechanism in another position.

When the printed circuit boards have all been placed into the enclosure 10 and are ready for operation, the knob 76 is pushed inward or toward the back of the chassis in the direction opposite to that indicated by arrow 86. This causes the shaft 70 and the cam plate 78 to move toward the rear of the unit. Stud 83 following the curvature of the cam slot 80 causes the L-shaped slider to move toward the left into a final position shown in FIG. 4. In this held state, each of the tabs 58 is located in front of the slot 43–45 in the rear portion 40″–42″, respectively, of the corresponding track. In those tracks having a printed circuit board, the tabs 58 have slid into the notch 82 in the lower edge of the printed circuit board. The switch actuator 66 has also moved to the left depressing the push button switch 64 energizing the power supply to provide electrical power to the back plane 32 and the other circuit boards in the enclosure. In this held state, the printed circuit boards cannot be removed from the enclosure as the tabs 58 within the notches 82 prevent the boards from being slid forward and unplugged from the back plane. Similarly, the tabs prevent other boards from being slid into vacant locations while power is being applied to the chassis.

By positioning the tabs 58 close to the ends of the rear sections of the tracks 40″–42″ and between the two track sections, the boards cannot be removed by bending them to move the notch to one side of the tab 58, thereby defeating the interlock system.

In order to release the boards, the knob 76 must again be pulled forward to place the slider 48 into the rightmost position as shown in FIG. 3 where the tabs 58 are again moved out of the notches 82 in the printed circuit boards. In this position, switch actuator 66 is no longer in contact with switch 64 thereby cutting off the electricity to the power supply on printed circuit board 62 which turns off the power to the other printed circuit boards in the enclosure 10.

The retaining mechanism 46 prevents a circuit board from being removed from or inserted into the chassis without the electrical power being turned off. The electrical interlock function provided by the mechanism 46 thereby prevents damage to the printed circuit boards caused by their removal or insertion while the power is being applied.

I claim:

1. A chassis having a plurality of locations for printed circuit boards, each location having at least one track for receiving an edge of a printed circuit board, said chassis including electrical connectors providing electrical interconnection of printed circuit boards inserted in said locations, the improvement comprising:

a printed circuit board retaining means for releasably holding a printed circuit board in each location, said retaining means having a held state and a released state;

a power supply including a printed circuit board inserted in one of said locations and coupled to one of the electrical connectors to supply electrical power to other electrical connectors of said chassis, and further including an electrical switch mounted on the printed circuit board, said switch having first and second states; and means coupled to said retaining means for placing the switch in the first state when said retaining means is in the released state and for placing the switch in the second state when the retaining means is in the held state.

2. The chassis as in claim 1 wherein said retaining means includes a plurality of tabs, each of which extends across a track in the held state and does not extend across a track in the released state.

3. The chassis as recited in claim 1 wherein the switch in the second state enables the application of electrical power from said power supply to the one electrical connector and in the first state disables the application of electrical power from said power supply to the one electrical connector.

4. The chassis as recited in claim 1 further comprising means for moving said retaining means between the held and released states, said moving means including a shaft, a cam attached to said shaft, and a cam follower attached to the retaining means and engaging said cam.

5. An electrical chassis comprising:
   an enclosure;
   a plurality of parallel tracks within the enclosure, said tracks having longitudinal slots therein;
   a power supply including a first printed circuit board having an edge located in the slot of one of the tracks, the edge having a notch, and further including a switch mounted on said power supply;
   a second printed circuit board having an edge located in the slot of another one of the tracks, the edge of the second printed circuit board having a notch;
   means for releasably engaging the notches of the printed circuit boards located in said tracks to retain the printed circuit boards in the chassis; and
   switch activation means for closing the power supply switch when said engaging means is engaging the notches of the printed circuit boards and opening the power supply switch when said engaging means is not engaging the notches.

6. The chassis as in claim 5 wherein each of said slotted tracks has two aligned sections spaced apart so that the notch in the printed circuit board edge located in the track is positioned between the two sections; and wherein said means for releasably engaging the notches is between the two sections of each track and includes a plurality of tabs each of which in a first position extends across the corresponding track into the notch of a printed circuit board that may be in the track, and said tabs being remote from the notches in a second position.

7. The chassis as in claim 6 wherein said means for releasably engaging the notches comprises an L-shaped member having a vertical portion from which said tabs extend.

8. The chassis as in claim 7 wherein the switch activation means comprises an actuator extending from the L-shaped member, the actuator engaging the switch on said power supply to close it only when the tabs are in the first position.

9. The chassis as in claim 6 wherein said switch activation means comprises an actuator extending from said means for releasably engaging the notches; said actuator engaging the power supply switch when said tabs are in the first position.

* * * * *